(12) United States Patent
Park

(10) Patent No.: US 6,727,735 B2
(45) Date of Patent: Apr. 27, 2004

(54) CHARGE PUMP CIRCUIT FOR REDUCING JITTER

(75) Inventor: Kwang-Il Park, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 89 days.

(21) Appl. No.: 10/196,402

(22) Filed: Jul. 16, 2002

(65) Prior Publication Data

US 2003/0107419 A1 Jun. 12, 2003

(30) Foreign Application Priority Data

Dec. 6, 2001 (KR) ........................... 2001-76880

(51) Int. Cl.[7] ............................................. H03L 7/06
(52) U.S. Cl. .................... 327/157; 327/536; 327/537; 363/59; 363/60
(58) Field of Search ................. 327/157, 534, 327/536, 537, 589, 590; 363/59, 60; 307/110

(56) References Cited

U.S. PATENT DOCUMENTS 4,371,797 A * 2/1983 Frank ........................ 327/382
5,942,929 A * 8/1999 Aparin ....................... 327/233
6,181,210 B1 * 1/2001 Wakayama ..................... 331/8
6,278,332 B1 * 8/2001 Nelson et al. ................. 331/1 A
6,320,470 B1 * 11/2001 Arai et al. .................... 331/17
6,362,679 B2 * 3/2002 Wile .......................... 327/382
6,531,913 B1 * 3/2003 Ross .......................... 327/536
6,590,432 B1 * 7/2003 Wu et al. ..................... 327/108

FOREIGN PATENT DOCUMENTS

EP         0798862 A1      10/1997
JP     20002867000 A  *    10/2000

OTHER PUBLICATIONS

Communication from Korean Intellectual Property Office dated Jul. 30, 2003 (3 pages).

* cited by examiner

*Primary Examiner*—Timothy P. Callahan
*Assistant Examiner*—An T. Luu
(74) *Attorney, Agent, or Firm*—Marshall, Gerstein & Borun LLP

(57) ABSTRACT

A semiconductor device is disclosed which includes an input unit for charging and discharging an output terminal in response to an input signal; and a dummy input unit to reduce jitter in a voltage associated with the output terminal.

42 Claims, 8 Drawing Sheets

< CHARGE PUMP CIRCUIT OF THE PRIOR ART >

< CHARGE PUMP CIRCUIT OF THE PRESENT INVENTION >

CHARGE PUMP CIRCUIT FOR REDUCING JITTER

TECHNICAL FIELD

Phase locked loops are disclosed, and, more particularly, charge pump circuits for reducing jitter in a phase locked loop (PLL) circuit are disclosed.

DESCRIPTION OF THE PRIOR ART

Semiconductor devices, such as a semiconductor memory device and a central processing unit (CPU), generate an internal clock signal using a clock buffer and a clock driver. However, the operating performance of these semiconductor devices deteriorate at high frequencies because the internal clock signal is delayed by a constant time period relative to an external clock signal.

As a result, an output data access time tAC (i.e., the time it takes for the data to be output after inputting the external clock signal), is longer than the generating time of the internal clock signal.

Thus, in order to reduce the performance deterioration of semiconductor devices having a long elapsing output data access time tAC, a circuit for synchronizing the internal clock signal with the external clock signal is required. The circuit for synchronizing the internal clock signal with the external clock signal is called a phase locked loop (PLL) circuit.

FIG. 1 is an internal block diagram of an ordinary prior art phase locked loop (PLL). Referring to FIG. 1, a phase locked loop 1000 includes a phase detector 100, a charge pump circuit 200, a loop filter 300, a voltage controlled oscillator (VCO) 400 and a frequency divider 500. The phase detector 100 compares a standard clock signal, which is in phase with an external clock, with an output phase of the frequency divider 500. If the output phase of the frequency divider 500 is slower than the phase of the standard clock signal, a pulse (designated as up signal (up)), is outputted from the phase detector 100 in order to increase the frequency. If the output phase of the frequency divider 500 is faster than the phase of the standard clock, a pulse (designated as down signal (down)), is outputted from the phase detector 100 in order to decrease the frequency. The charge pump circuit 200 is responsive to up or down signals received directly from the phase detector, or inverted up and down signals (/up or /down), which is the signal from the phase detector inverted by inverters 110 or 120.

A pulse output of the charge pump circuit 200 is transmitted to the loop filter 300. The filter 300 has a resistor 310 and a capacitor 320. When the down signal is transmitted to the charge pump circuit 200, an electric charge of the capacitor 320 in the loop filter 300 is reduced. When the up signal (up) is transmitted to the charge pump circuit 200, the electric charge of the capacitor 320 in the loop filter 300 is increased. The pulse output of the charge pump circuit 200 is transformed into a DC analog signal by the loop filter 200.

The voltage controlled oscillator 400 receives the DC analog signal from the loop filter 300 and outputs a constant frequency signal. The frequency divider 500 operates as a counter and divides the constant frequency signal from the voltage controlled oscillator 400 into N in order to facilitate comparison at the phase detector 100.

In the phase locked loop 1000, the phase detector 100, the charge pump circuit 200, the voltage controlled oscillator 400 and the frequency divider 500 are formed as a loop to control the phase. The number of the output frequency is N-fold increase relative to the number of the input frequency. N is set to a temporary value to get a natural multiple frequency of the input frequency.

FIG. 2A is an internal circuit diagram of a prior art charge pump circuit 200 used in FIG. 1. Referring to FIG. 2A, the internal circuit of the charge pump circuit 200 includes a first transistor MP1. An operating voltage VDD is provided through a drain of the first transistor and a bias voltage Vbiasp is applied through a gate of the first transistor for maintaining the turn-on state. The circuit 200 includes a second transistor MP2. A source of the first transistor MP1 is connected to a drain of the second transistor, and the up signal (up) is input to a gate of the second transistor. A third transistor MN2, is connected to the source of the second transistor MP2. The down signal is input to a gate of the third transistor MN2. A fourth transistor MN1 is connected to a source of the third transistor MN2. A bias voltage Vbiasn is applied to a gate of the fourth transistor MN1 for maintaining the turn-on state.

The first and second transistors MP1 and MP2 are P channel MOS transistors and the third and fourth transistors MN2 and MN1 are N channel MOS transistors. Furthermore, an output terminal OUT is connected commonly with the source of the second transistor MP2 and the drain of the third transistor MN2.

FIG. 2B is an equivalent circuit when the charge operation of the charge pump is performed by the up signal (up). FIG. 2C is an equivalent circuit when the discharge operation of the charge pump is performed by the down signal.

Referring to FIG. 2B, when the low level inverted up signal (/up) is input to the second transistor MP2, the second transistor is turned on and the operating voltage VDD applied to the drain of the first transistor MP1 is charged through the output terminal OUT because the transistor MP1 is in the turn on state.

Referring to FIG. 2C, when the high level down signal is input to the third transistor MN2, the third transistor is turned on and a charged voltage is discharged through a ground VSS because the fourth transistor MN1 is in the turn on state, and the output terminal OUT and the ground VSS are shorted.

As shown in FIG. 2B, a parasitic capacitance Cfp is generated between the operating voltage VDD and a node C. Thus, when the first transistor MP1 is changed from the turn off state to the turn on state, the potential of the node C is changed from a power potential to the output terminal OUT potential and a current Icfp flows based on such potential difference and parasitic capacitance Cfp.

Furthermore, a parasitic capacitance Cfn is generated between the ground and a node D. (See FIG. 2C). Thus, when the third transistor MN2 is changed from the turn off state to the turn on state, the node D is changed from the ground potential to the output terminal OUT potential and a current Icfn based on such potential difference and parasitic capacitance Cfn.

Therefore, a charge sharing occurs because of the parasitic capacitance so that the current supply from the output terminal OUT is unstable.

That is, overshoots occur in the output current of the charge pump circuit because of the current icfp or icfn. Thus, a jitter occurs in the voltage controlled oscillator 400, which is connected to the output terminal OUT. As a result, an error is generated in the system because the system is controlled repeatedly by the output signal of the voltage controlled oscillator 400.

This problem can be eliminated by forming the potential of nodes C and D when transistors MP2 and MN2 are in the turn off state. However, the potential of nodes C and D are identical to the potential of the output terminal OUT.

FIG. 3 is a prior art charge pump circuit 200' for controlling the charge sharing when the up or down signal (up or down) are switched. Referring to FIG. 3, the charge pump circuit 200' includes a first transistor MP1 (wherein an operating voltage VDD is provided through a drain and a bias voltage Vbiasp is applied through a gate for maintaining the turn-on state), a second transistor MP2 (wherein a source of the first transistor MP1 is connected and the inverted signal (/up) is input through a gate), a third transistor MP3 (wherein a source of the second transistor MP2 is connected and the up signal (up) is input through a gate), a fourth transistor MN2 (wherein a source of the second transistor MP2 is connected and the down signal is inputted through a gate), a fifth transistor MN3 (wherein a source of the third transistor MP3 is connected and the /down signal is inputted through a gate), a sixth transistor MN1 (wherein a drain is connected commonly to the source of the fourth transistor MN2 and the source of the fifth transistor MN3 and a bias voltage Vbiasn is applied through a gate for maintaining the turn-on state), and an operational amplifier A, wherein the source of the second transistor MP2 and the drain of the fourth transistor MN2 is connected commonly to a positive input terminal of the OP AMP A and the source of the third transistor MP3 and the drain of the fifth transistor MN3 is connected commonly to an inverting terminal of the OP AMP A.

The first, second and third transistors MP1, MP2 and MP3 are PMOS transistors, and the fourth, fifth and sixth transistors MN2, MN3, MN1 are NMOS transistors. Furthermore, the output terminal Vout is connected commonly to the source of the second transistor MP2, the drain of the fourth transistor MN2 and the positive input terminal of the operational amplifier A. A capacitor C1 is a phase compensating capacitance for reducing the oscillation of the operational amplifier A.

However, capacitors Cfp and Cfn are parasitic capacitance devices, which are not actual devices.

When the up or inverted up signal (up or /up) and the down or inverted down signal (down or /down) are changed, voltages of nodes N3 and N4 are identically maintained and the charge sharing from the parasitic capacitance is controlled by the operational amplifier A. As shown in FIG. 3, the operational amplifier A becomes a buffer having a voltage gain of 1 if a negative feedback operation is performed.

Hereinafter, the operation of the circuit in FIG. 3 will be described. When the inverted up signal (/up) is applied to the second transistor MP2, the second transistor MP2 is turned on and the loop filter 300 is charged. At this time, the standard voltage, which is equal to the voltage in the output terminal Vout, is applied to the negative input terminal of the operational amplifier A in order to operate as a buffer for a certain period of time.

Furthermore, the same voltage as the voltage in the output terminal Vout is applied to the node N4 by the operational amplifier A during the charge operation. The same voltage as the voltage in the output terminal Vout is maintained in the node N1 by turning on the third transistor or the fourth transistor. Also in the switching of up or inverted up signal (up or /up) and the down or inverted down signal (down or /down), overshoots by parasitic capacitors Cfp and Cfn of the charge sharing can be under control.

However, when the high level down signal is applied to the fourth transistor MN2 in the charge pump circuit 200', the fourth transistor MN2 is turned on and the charged voltage in capacitors of the loop filter 300 is discharged to the ground VSS through the output terminal Vout because the sixth transistor MN1 is in the turned on state. At this time, the operational amplifier A is operated as a buffer in order to stabilize the output voltage of the output terminal Vout by minimizing the voltage change rate.

However, the charge pump circuit in FIG. 3 has the following problems. The up or inverted up signal (up or /up) and the down or inverted down signal (down or /down) are signals, which are switched continuously, and the second, third, fourth and fifth transistors MP2, MP3, MN2 and MN3 are repeatedly turned on and off by these signals. Even though the operational amplifier A is operated as the buffer, the charge sharing problem cannot be solved completely because a delay time occurs for outputting the same output voltage. Furthermore, the voltage across the third transistor MP2 cannot be always maintained at the same voltage during the charge pump operation.

Another problem is that a kickback phenomenon occurs when the up or inverted up signal (up or /up) and down or inverted down signal (down or /down) are switched at high speed. The kickback phenomenon is a phenomenon wherein the opposite voltage is induced suddenly when the voltage of some node is rapidly changed. It is because electric charges below the gate of the MOS transistor are drifted away to both directions of the transistor when the switching of the MOS transistor occurs.

A glitch, which is manifested as jitter, is generated by the kickback phenomenon. The kickback phenomenon can be solved by induction of the input as a transmission gate. However, the size of the PMOS transistor has to be 1.5 to 3 times larger than the size of the NMOS transistor in order to flow the same current. Thus, the size of the parasitic capacitor caused by the PMOS and NMOS transistors is changed so that the other problem can be addressed.

SUMMARY OF THE DISCLOSURE

In accordance with a disclosed embodiment, a semiconductor device is provided which includes an input circuit to charge and discharge a voltage associated with an output terminal in response to a first input signal. The device also includes a dummy input circuit responsive to a second input signal to reduce jitter in the voltage associated with the output terminal. The second input signal is an inverted version of the first input signal.

In accordance with another disclosed embodiment, a charge pump circuit is provided which includes a charge circuit to develop a voltage at an output terminal in response to a first input signal. The charge pump circuit also includes a discharge circuit to discharge the voltage at the output terminal in response to a second input signal; a dummy charge responsive to a first inverted signal of the first input signal to reduce jitter; and a dummy discharge circuit responsive to a second inverted signal of the second input signal to reduce jitter.

DETAILED DESCRIPTION OF THE PREFERRED EXAMPLES

Hereinafter, an exemplary ferroelectric random access memory (FeRAM) constructed in accordance with the teachings of the present invention will be described in detail referring to the accompanying drawings.

Figure 1:
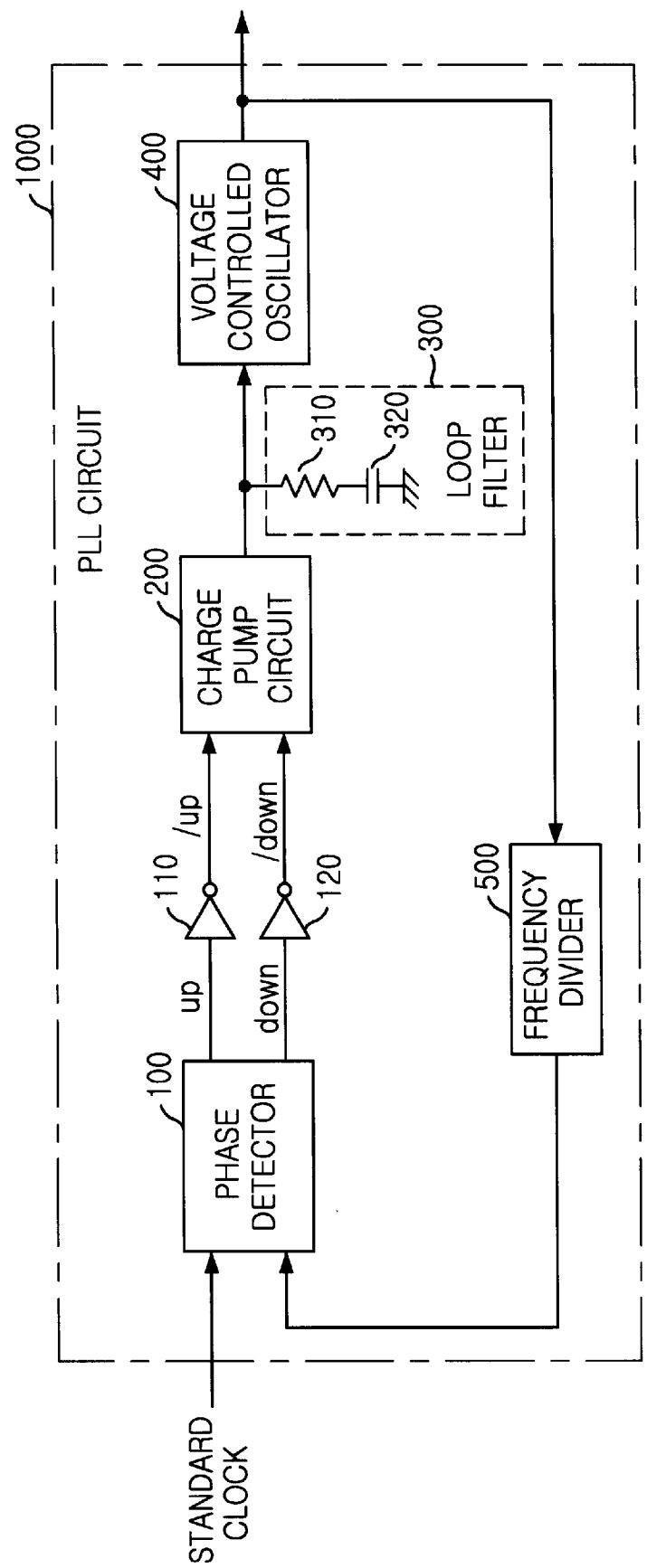
FIG. 1 is an internal block diagram of an ordinary, prior art, phase locked loop (PLL).
Figure 2A:
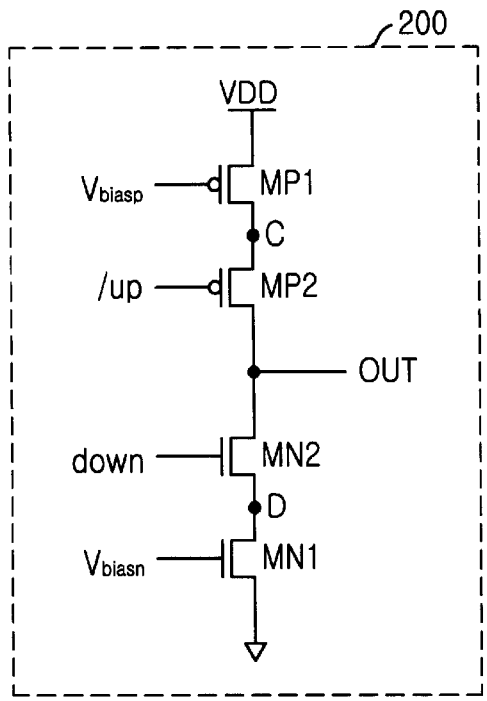
FIG. 2A is an internal circuit diagram of the charge pump circuit of FIG. 1.
Figure 2B:
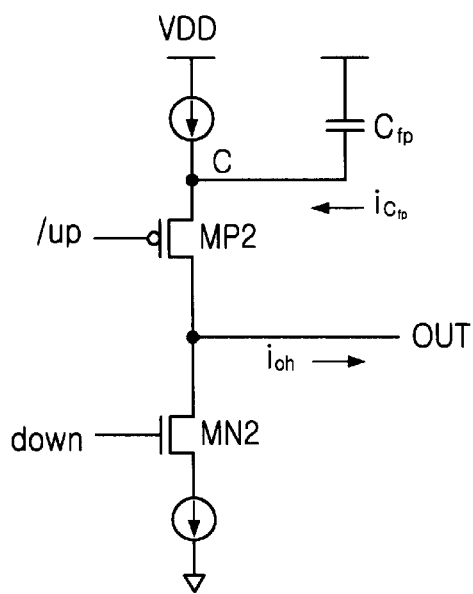
FIG. 2B is an equivalent circuit to the circuit of FIG. 2A when the charge operation of the charge pump is performed by the up signal.
Figure 2C:
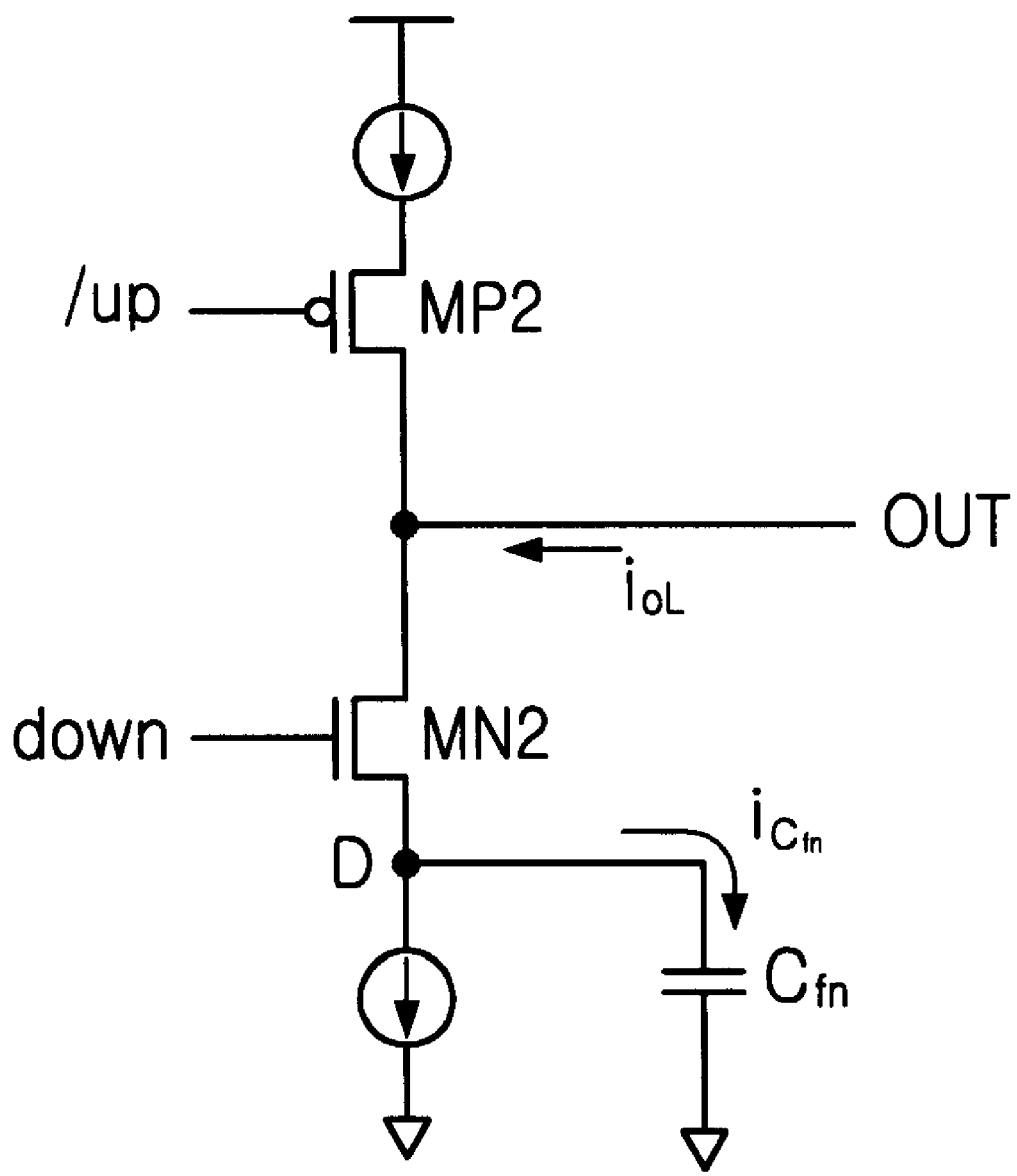
FIG. 2C is an equivalent circuit to the circuit of FIG. 2A when the discharge operation of the charge pump is performed by the down signal.
Figure 3:
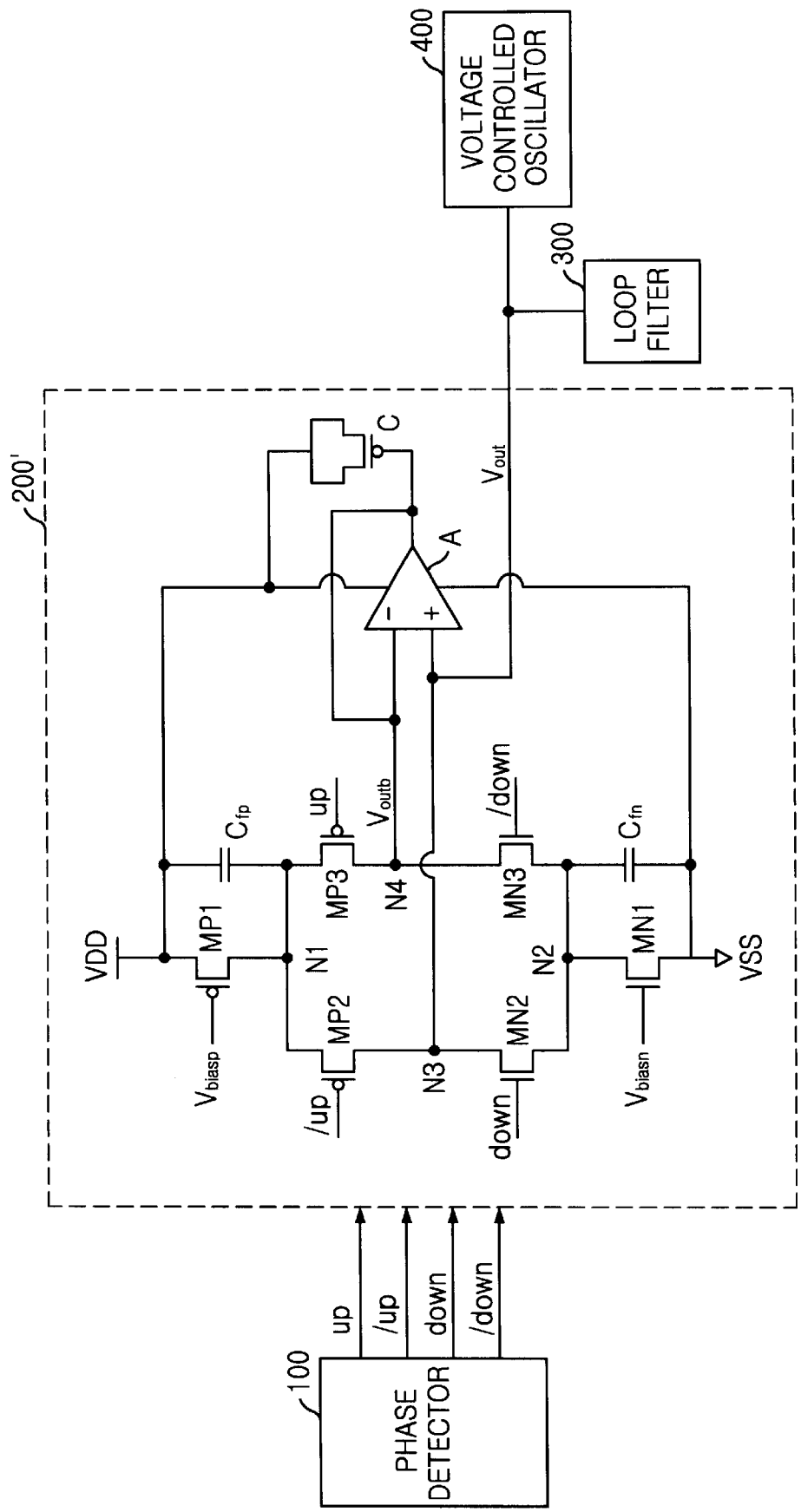
FIG. 3 is a prior art charge pump circuit for controlling charge sharing when the up or down signal is switched.
Figure 4:
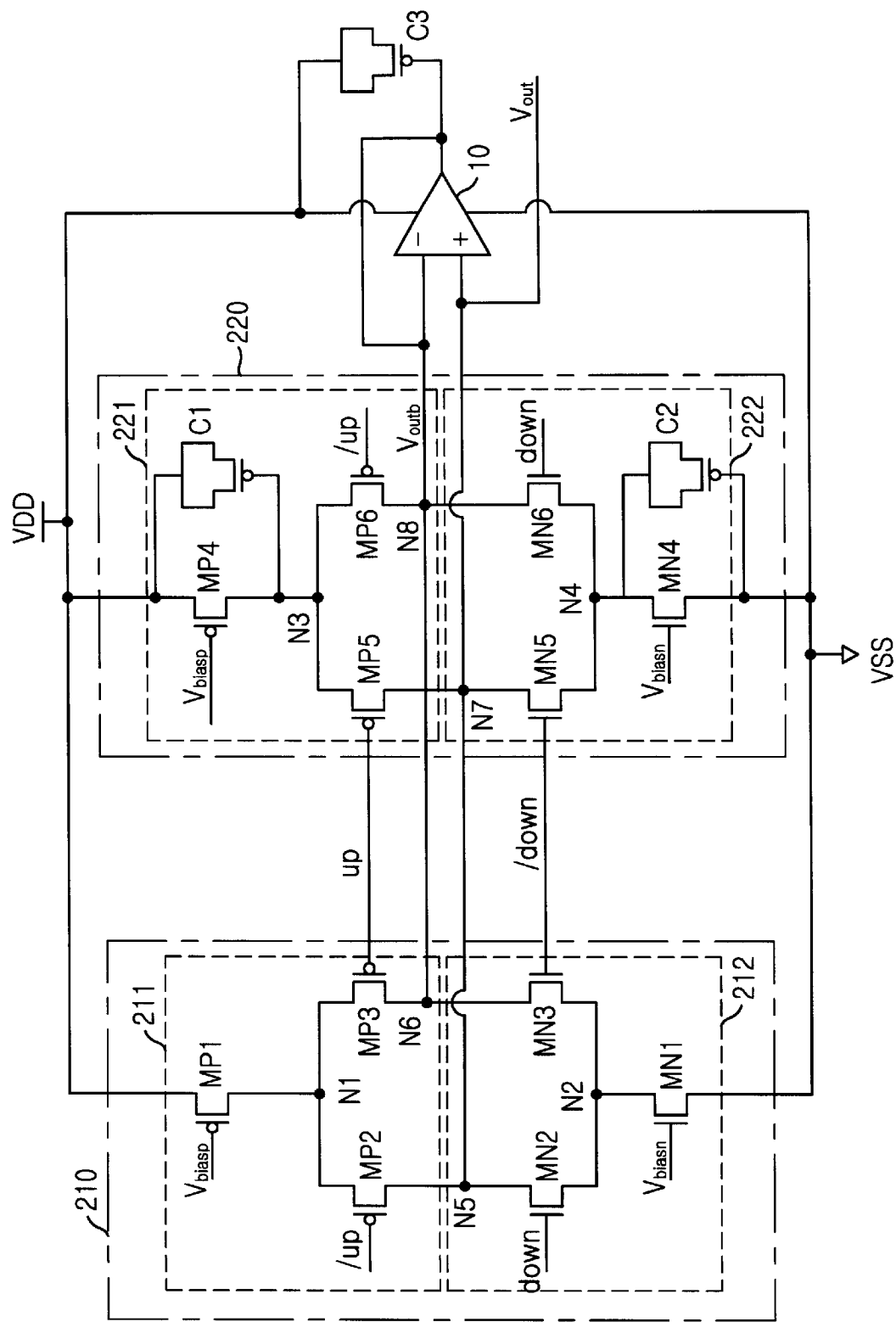
FIG. 4 is a diagram of an exemplary charge pump circuit constructed in accordance with the teachings of the present invention.

FIG. 4 is a diagram of a charge pump circuit. The charge pump circuit includes an input unit 210 for charging or discharging an electric charge depending on a switching of up and inverted up signals (up and /up) and down and inverted down signals (down and /down). It also includes a dummy input unit 220, which has the identical configuration of the input unit 210 for inversely switching signals of the input unit 210. The charge pump circuit further includes an operational amplifier 10 for controlling charge sharing. It also includes a capacitor C3 for reducing the oscillation of the operational amplifier 10.

The input unit 210 includes a charge unit 211 for storing the charge of an output terminal of the input unit 210 depending on up and inverted up signals (up and /up). It also includes a discharge unit 212 for discharging the charge from the output terminal of the input unit 210 depending on down and inverted down signals (down and /down).

The charge unit 211 includes a first transistor MP1, to which an operating power VDD is provided through a drain. A source of the transistor MP1 is connected to a node N1. A bias voltage Vbiasp is applied through a gate for maintaining the turn-on state of the transistor MP1. A second transistor MP2 includes a drain connected to the node N1, and a source connected to a node N5. An inverted up signal (/up) is inputted through a gate of the second transistor MP2. A third transistor MP3 includes a drain connected to the node N1 and a source connected to a node N6. An up signal (up) is inputted through a gate of the transistor MP3.

The charge unit 212 includes a fourth transistor MN2. A drain of the transistor MN2 is connected to the node N5, a source of the transistor MN2 is connected to a node N2, and a down signal (down) is inputted through a gate of the transistor MN2. A fifth transistor MN3 includes a drain connected to the node N6. An inverted down signal (/down) is inputted through a gate of the transistor MN3. A sixth transistor MN1 includes a drain connected to the node N2. A bias voltage Vbiasn is applied through a gate of transistor MN1 for maintaining the turn-on state of the transistor MN1. A source of the transistor MN 1 is grounded.

The dummy input unit 220 includes a dummy charge unit 221 for inverted switching of a switching input signal from the charge unit 211 and a dummy discharge unit 222 for inverted switching of a switching input signal from the discharge unit 212.

The dummy charge unit 221 includes a seventh transistor MP4. The operating power VDD is provided through a drain of the transistor MP4, a source of the transistor MP4 is connected to a node N3, and a bias voltage Vbiasp is applied through a gate for maintaining the turn-on state of the transistor MP4. An eighth transistor MP5 includes a drain connected to the node N3, and a source connected to a node N7. The up signal (up) is inputted through a gate of the transistor MP5. A ninth transistor MP6 includes a drain connected to the node N6, and a source connected to a node N8. The inverted up signal (/up) is inputted through a gate of the transistor MP6.

Also, the dummy discharge unit 222 includes a tenth transistor MN5. A drain of the transistor MN5 is connected to the node N7, a source of the transistor MN5 is connected to a node N4, and the inverted down signal (/down) is inputted through a gate of the transistor MN5. An eleventh transistor MN6 includes a drain connected to a node N8, and a source connected to a node N4. The down signal (down) is inputted through a gate of the transistor MN5. A twelfth transistor MN4 includes a drain connected to the node N4. A bias voltage Vbiasn is applied through a gate of the transistor MN4 for maintaining the turn-on state of the transistor MN4. A source of the transistor MN4 is grounded.

Capacitors C1 and C2 are devices for symmetrically forming a parasitic capacitance of the input unit 210 and the dummy input unit 220.

A positive terminal of the operational amplifier 10 for controlling charge sharing is connected to the node N5 in the input unit 210 and the node N7 in the dummy input unit 220. Also, a negative terminal of the operational amplifier 10 is connected to the node N6 in the input unit 210 and the node N8 in the dummy input unit 220. A capacitor C3 provides a phase compensating capacitance for reducing the oscillation of the operational amplifier 10.

Hereinafter, the operation of the charge pump circuit of FIG. 4 is explained. The input unit 210 is for charge pumping. The dummy input unit 220 is an additional unit for the stable operation of the input unit 210. The eighth, ninth, tenth and eleventh transistors MP5, MP6, MN5 and MN6 of the dummy input unit 220 are formed as transistors, which are symmetrical to the input unit 210. The currents flowing through the seventh and twelfth transistors MP4 and MN4 are controlled to flow less than the currents flowing through the first and sixth transistors MP1 and MN1.

Thus, mis-operation of the charging or discharging of an output terminal in the dummy input unit 220 can be avoided. Therefore, the sizes of the parasitic capacitance caused by the seventh and the twelfth transistors MP4 and MN4 are formed less than the sizes of the first and the sixth transistors MP1 and MN1. Thus, capacitors C1 and C2 are compensating capacitors for making the size of the parasitic capacitors identical.

The charging and discharging of the charge pump is operated by the input unit 210. The dummy input unit 220 is an additional unit for removing a glitch by generating an inverse signal of the phase.

The second transistor MP2 is turned on when the inverted up signal (/up) is inputted through the gate of the second transistor MP2. The first transistor MP1, which is operated as a current source, is turned on so charge is stored in the output terminal Vout through nodes N1 and N5.

During charging, a glitch is generated by the charge sharing from the parasitic capacitor in the node N1.

However, the node N5 is connected to the node N7 of the additional dummy charge unit 221. The input signal, which is opposite to the signal applied to the gate of the second transistor MP2, is applied to the gate of the eighth transistor MP5. Therefore, a glitch, which is opposite in phase, is generated by the dummy charge unit 221 to offset the glitch in the charge unit 211. Thus, substantially no glitch is generated at the output terminal Vout.

Furthermore, a kickback phenomenon can be solved. The kickback phenomenon is generated in the node N5 and the opposite kickback phenomenon is generated in the node N7 so that the kickback phenomenon does not occur in the output terminal Vout because opposite input signals are applied to the gates of the second and eighth transistors MP2 and MP5.

Hereinafter, the discharge operation will be described. The fourth transistor MN2 is turned on when the down signal (down) is inputted to the gate of the fourth transistor MN2 in the discharge unit 212. The sixth transistor MN1, which is operated as a current source, is turned on so charge is discharged from the output terminal Vout to the ground through nodes N5 and N2.

During discharge, a glitch is generated by the parasitic capacitor in the node N2. However, the node N5 is connected to the node N7 of the additional dummy discharge unit 222. The input signal, which is opposite to the signal applied to the gate of the fourth transistor MN2, is applied to the gate of the tenth transistor MN5. Therefore, a glitch, which is opposite in phase, is generated by the dummy discharge unit 222 to offset the glitch in the discharge unit 212. Thus, substantially no glitch is generated at the output terminal Vout.

Furthermore, the kickback phenomenon is generated in the node N5 and the opposite kickback phenomenon is generated in the node N7 so that the kickback phenomenon does not occur at the output terminal Vout because the opposite input signals are applied to the gates of the fourth and tenth transistors MP2 and MP5.

Figure 5:
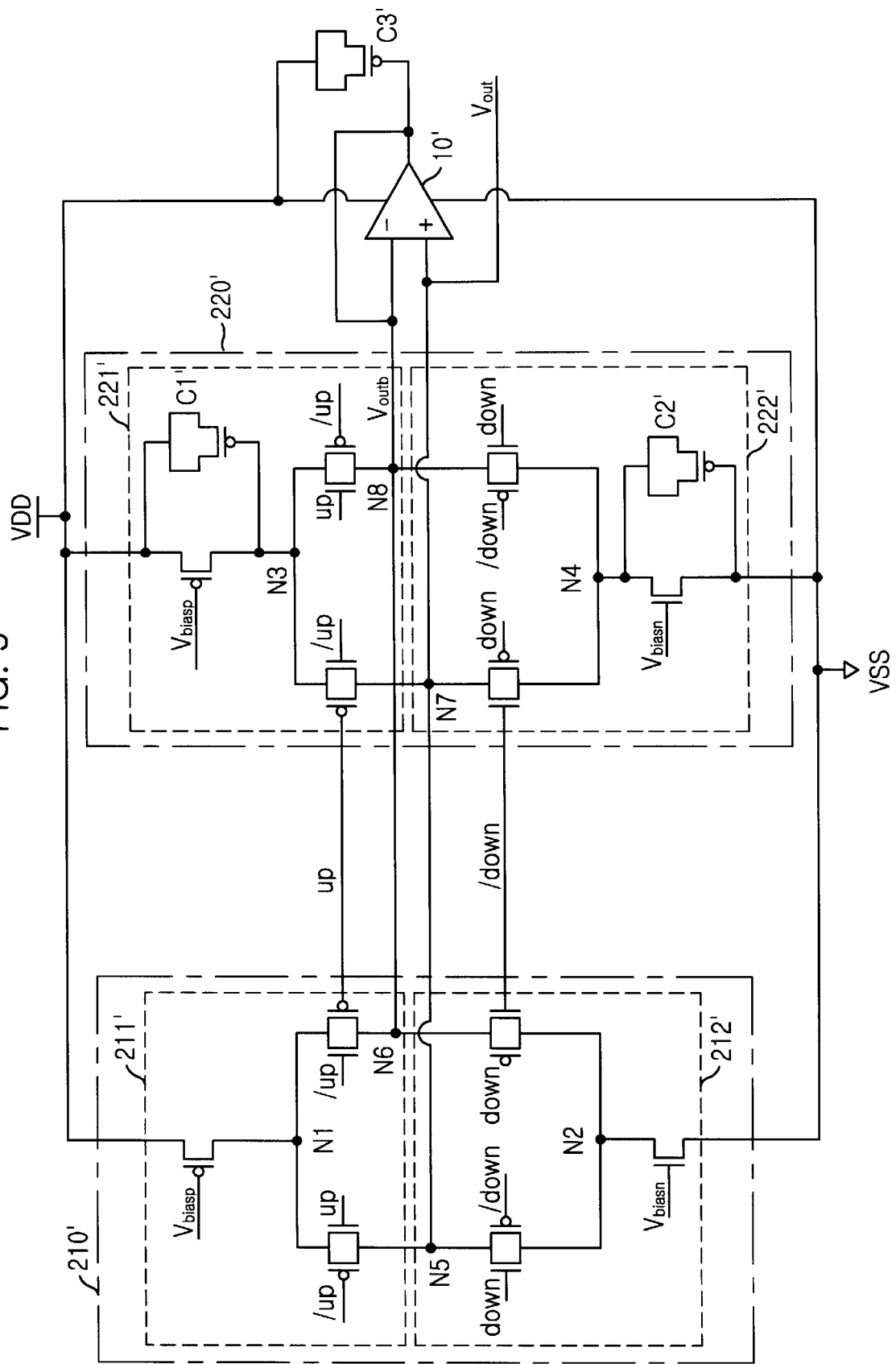
FIG. 5 is a diagram of another exemplary charge pump circuit constructed in accordance with the teachings of the present invention.

FIG. 5 is a diagram of another exemplary charge pump circuit constructed in accordance with the teachings of the present invention. In the circuit of FIG. 5, the transistors in all of the input units of the circuit of FIG. 4 are replaced with transmission gates. By substituting transmission gates, the kickback phenomenon and the charge sharing problems are completely solved because the parasitic capacitance occurs symmetrically.

The kickback phenomenon is reduced even during the change of the input signal in the charge pump, so that the jitter is also reduced. Furthermore, the charge sharing problem is almost completely solved.

Figure 6A:
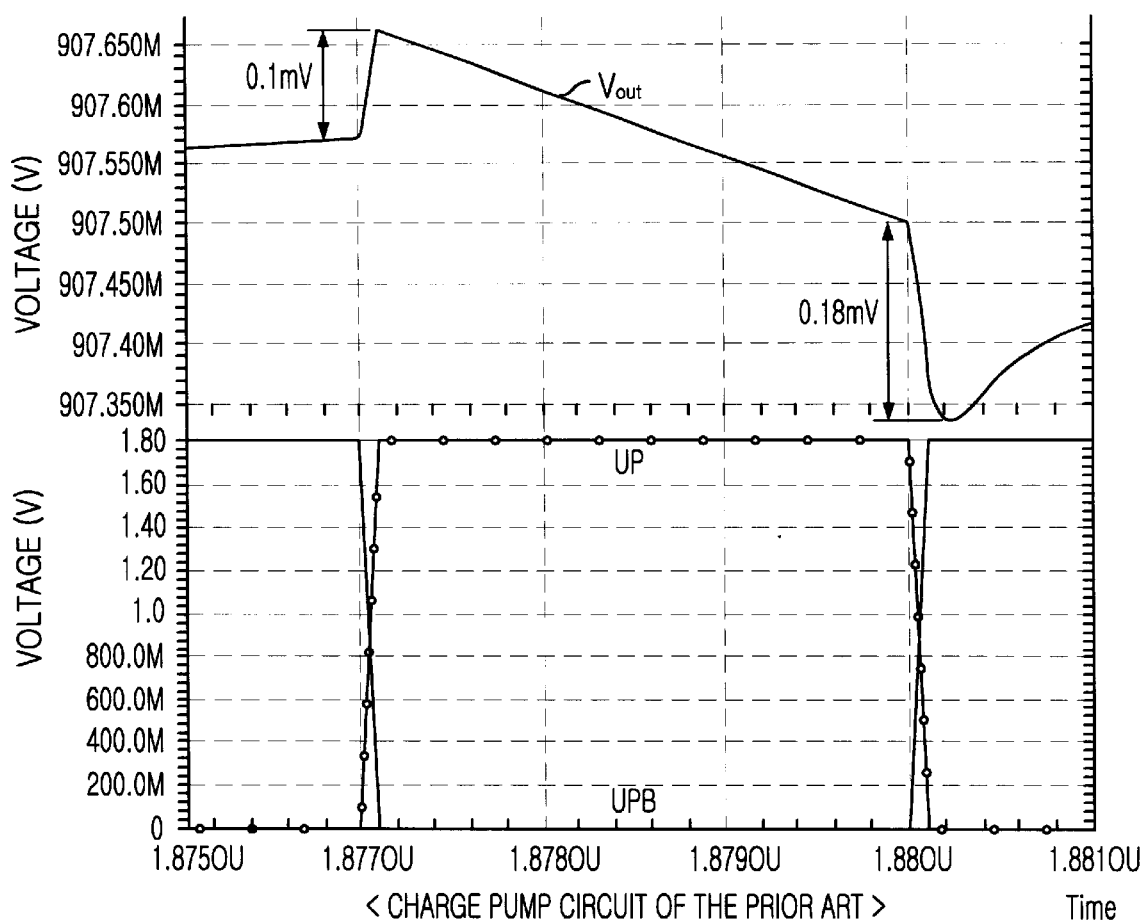
FIG. 6A is a simulation waveform graph of input and output voltages of an exemplary prior art charge pump circuit.
Figure 6B:
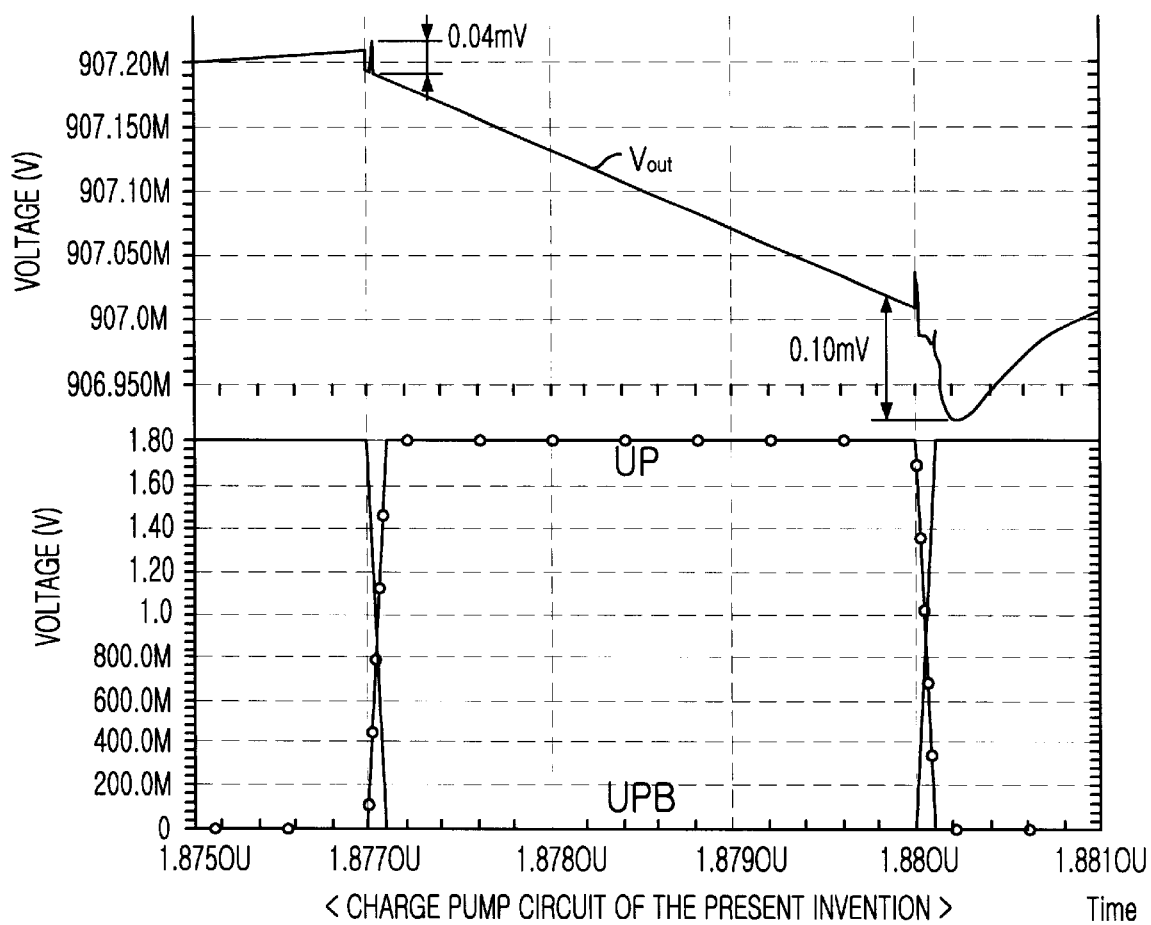
FIG. 6B is a simulation waveform graph of input and output voltages of an exemplary charge pump circuit constructed in accordance with the teachings of the present invention.

FIG. 6A is a simulation waveform graph of input and output voltages of an exemplary prior art charge pump circuit. FIG. 6B is a simulation waveform graph of input and output voltages of an exemplary charge pump circuit constructed in accordance with the teachings of the present invention.

Comparing FIG. 6A and FIG. 6B, the change of the output voltage is more stable in the example of FIG. 6B than in FIG. 6A when the up signals and/or the down signals are changed.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. A semiconductor device, comprising:
   an input circuit to charge and discharge a voltage associated with an output terminal depending on a switching of first input signals and inverted first input signals; and
   a dummy input circuit responsive to a second input signals to reduce jitter in the voltage associated with the output terminal, by generating an inversed signal of the voltage in phase, the voltage is associated with the output terminal,
   wherein the dummy input circuit has the identical configuration of the input circuit, and the second input signals are inverted versions of the input signals and the inverted input signals.

2. An apparatus as recited in claim 1, wherein the dummy input circuit includes:
   a compensating capacitor to compensate for a parasitic capacitor associated with the input circuit;
   an inverter to invert the first input signal to develop the second input signal; and
   a current source.

3. An apparatus as recited in claim 1, further comprising a buffer in circuit with the output terminal for reducing a rate of change of the voltage associated with the output terminal.

4. A charge pump circuit comprising:
   a charge circuit to develop a voltage at an output terminal in response to a first input signal;
   a discharge circuit to discharge the voltage at the output terminal in response to a second input signal;
   a dummy charge circuit responsive to a inverted signal of the first input signal to reduce jitter by generating an inversed signal of the voltage in phase; and
   a dummy discharge circuit responsive to a inverted signal of the second input signal to reduce jitter by generating an inversed signal of the voltage in phase.

5. An apparatus as recited in claim 4, further comprising a buffer in circuit with the output terminal for reducing a rate of change of the voltage at the output terminal.

6. An apparatus as recited in claim 4, wherein the first input signal and the first inverted input signal are input substantially simultaneously and the second input signal and the second inverted signal are input substantially simultaneously.

7. An apparatus as recited in claim 4, wherein the charge circuit comprises:
   a first current source;
   a first switching device to couple the first current source and the output terminal in response to the first input signal;
   a second output terminal; and
   a second switching device to couple the second output terminal and the first current source in response to the first inverted signal.

8. An apparatus as recited in claim 4, wherein the discharge circuit comprises:
   a ground terminal;
   a first switching device to couple the ground terminal and the output terminal in response to the second input signal;
   an input terminal; and
   a second switching device to couple the input terminal and the ground terminal in response to the second inverted signal.

9. An apparatus as recited in claim 7, further comprising a buffer in circuit with the output terminal for reducing a rate of change of the voltage at the output terminal.

10. An apparatus as recited in claim 9, wherein the buffer comprises a negative feedback operational amplifier where a positive input terminal of the operational amplifier is connected to the output terminal and a negative input terminal of the operational amplifier is connected to a negative output terminal.

11. An apparatus as recited in claim 7, wherein the dummy charge circuit comprises:
   a second current source;
   a third switching device to couple the second current source and the output terminal in response to the first inverted signal; and
   a fourth switching device to couple a negative output terminal and the second current source in response to the first signal.

12. An apparatus as recited in claim 11, wherein the dummy charge circuit further comprises a compensating capacitor in circuit with a power supply and a node between the second current source and the third switching device.

13. An apparatus as recited in claim 12, wherein the compensating capacitor has a size which is substantially equivalent to a difference between a parasitic capacitance in the charge circuit and a parasitic capacitance in the dummy charge circuit.

14. An apparatus as recited in claim 8, wherein the dummy discharge circuit comprises:
   a second ground terminal;
   a third switching device to couple the second ground terminal and the output terminal in response to the second inverted signal;
   a second output terminal; and
   a fourth switching device to couple the second input terminal and the ground terminal in response to the second input signal.

15. An apparatus as recited in claim 14, wherein the dummy discharge circuit further comprises a compensating capacitor in circuit with the second ground terminal and the third switching circuit.

16. An apparatus as recited in claim 15, wherein the compensating capacitor has a size which is substantially equivalent to a difference between a parasitic capacitance in the discharge circuit and a parasitic capacitance in the dummy discharge circuit.

17. An apparatus as recited in claim 11, wherein the second current source flows less current than the first current source.

18. An apparatus as recited in claim 14, wherein the second current source flows less current than the first current source.

19. An apparatus as recited in claim 11, wherein each of the first and second current sources includes a transistor having a predetermined voltage applied to a gate.

20. An apparatus as recited in claim 14, wherein each of the first and second current sources includes a transistor having a predetermined voltage applied to a gate.

21. An apparatus as recited in claim 11, wherein each of the first, second, third and fourth switching devices comprises a transistor.

22. An apparatus as recited in claim 14, wherein each of the first, second, third and fourth switching devices comprises a transistor.

23. An apparatus as recited in claim 11, wherein each of the first, second, third and fourth switching devices comprises a transmission gate.

24. The apparatus as recited in claim 14, wherein each of the first, second, third and fourth switching devices comprises a transmission gate.

25. A charge pump circuit comprising:
   a charge circuit to develop a voltage at an output terminal in response to a first input signal;
   a discharge circuit to discharge the voltage at the output terminal in response to a second input signal;
   a dummy charge responsive to a first inverted signal of the first input signal to reduce jitter;
   a dummy discharge circuit responsive to a second inverted signal of the second input signal to reduce jitter;
   wherein the charge circuit further comprises a first current source;
   a first switching device to couple the first current source and the output terminal in response to the first input signal;
   a second output terminal; and
   a second switching device to couple the second output terminal and the first current source in response to the first inverted signal.

26. A charge pump circuit comprising:
   a charge circuit to develop a voltage at an output terminal in response to a first input signal;
   a discharge circuit to discharge the voltage at the output terminal in response to a second input signal;
   a dummy charge responsive to a first inverted signal of the first input signal to reduce jitter;
   a dummy discharge circuit responsive to a second inverted signal of the second input signal to reduce jitter;
   wherein the discharge circuit further comprises a ground terminal;
   a first switching device to couple the ground terminal and the output terminal in response to the second input signal;
   an input terminal; and
   a second switching device to couple the input terminal and the ground terminal in response to the second inverted signal.

27. An apparatus as recited in claim 25, further comprising a buffer in circuit with the output terminal for reducing a rate of change of the voltage at the output terminal.

28. An apparatus as recited in claim 27, wherein the buffer comprises a negative feedback operational amplifier where a positive input terminal of the operational amplifier is connected to the output terminal and a negative input terminal of the operational amplifier is connected to a negative output terminal.

29. An apparatus as recited in claim 25, wherein the dummy charge circuit comprises:
   a second current source;
   a third switching device to couple the second current source and the output terminal in response to the first inverted signal; and
   a fourth switching device to couple a negative output terminal and the second current source in response to the first signal.

30. An apparatus as recited in claim 29, wherein the dummy charge circuit further comprises a compensating capacitor in circuit with a power supply and a node between the second current source and the third switching device.

31. An apparatus as recited in claim 30, wherein the compensating capacitor has a size which is substantially equivalent to a difference between a parasitic capacitance in the charge circuit and a parasitic capacitance in the dummy charge circuit.

32. An apparatus as recited in claim 26, wherein the dummy discharge circuit comprises:
- a second ground terminal;
- a third switching device to couple the second ground terminal and the output terminal in response to the second inverted signal;
- a second output terminal; and
- a fourth switching device to couple the second input terminal and the ground terminal in response to the second input signal.

33. An apparatus as recited in claim 32, wherein the dummy discharge circuit further comprises a compensating capacitor in circuit with the second ground terminal and the third switching circuit.

34. An apparatus as recited in claim 33, wherein the compensating capacitor has a size which is substantially equivalent to a difference between a parasitic capacitance in the discharge circuit and a parasitic capacitance in the dummy discharge circuit.

35. An apparatus as recited in claim 29, wherein the second current source flows less current than the first current source.

36. An apparatus as recited in claim 32, wherein the second current source flows less current than the first current source.

37. An apparatus as recited in claim 29, wherein each of the first and second current sources includes a transistor having a predetermined voltage applied to a gate.

38. An apparatus as recited in claim 32, wherein each of the first and second current sources includes a transistor having a predetermined voltage applied to a gate.

39. An apparatus as recited in claim 29, wherein each of the first, second, third and fourth switching devices comprises a transistor.

40. An apparatus as recited in claim 32, wherein each of the first, second, third and fourth switching devices comprises a transistor.

41. An apparatus as recited in claim 29, wherein each of the first, second, third and fourth switching devices comprises a transmission gate.

42. The apparatus as recited in claim 32, wherein each of the first, second, third and fourth switching devices comprises a transmission gate.

* * * * *